US009885748B2

(12) United States Patent
Eckert et al.

(10) Patent No.: US 9,885,748 B2
(45) Date of Patent: Feb. 6, 2018

(54) MODULE TESTING UTILIZING WAFER PROBE TEST EQUIPMENT

(71) Applicant: International Business Machines Corporation, Armonk, NY (US)

(72) Inventors: Martin Eckert, Boeblingen (DE); Eckhard Kunigkeit, Stuttgart (DE); Quintino L. Trianni, Boeblingen (DE); Christian Zoellin, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 14/734,341

(22) Filed: Jun. 9, 2015

(65) Prior Publication Data

US 2016/0365268 A1    Dec. 15, 2016

(51) Int. Cl.
   *G01R 31/28*    (2006.01)
   *G01R 1/04*    (2006.01)

(52) U.S. Cl.
   CPC ....... *G01R 31/2886* (2013.01); *G01R 1/0433* (2013.01); *G01R 1/0491* (2013.01); *G01R 31/2867* (2013.01)

(58) Field of Classification Search
   CPC ................ G01R 1/0433; G01R 1/0491; G01R 31/2851–31/3016
   See application file for complete search history.

(56) References Cited

U.S. PATENT DOCUMENTS

| 5,986,460 A * | 11/1999 | Kawakami ......... G01R 1/07307 257/48 |
| 6,187,654 B1 * | 2/2001 | Tieber .................. B28D 5/0094 257/E21.599 |
| 6,229,320 B1 * | 5/2001 | Haseyama ........... G01R 1/0466 324/750.25 |
| 6,644,982 B1 * | 11/2003 | Ondricek ............. G01R 1/0408 206/724 |

(Continued)

FOREIGN PATENT DOCUMENTS

| CN | 202126482 U | 1/2012 |
| CN | 101545948 A | 10/2012 |

(Continued)

OTHER PUBLICATIONS

List of IBM Patents or Patent Applications Treated as Related (Appendix P) dated Aug. 27, 2015, 2 pages.

*Primary Examiner* — Stephen W Jackson
*Assistant Examiner* — Christopher Clark
(74) *Attorney, Agent, or Firm* — Francis Lammes; Stephen J. Walder, Jr.; Damion Josephs

(57) ABSTRACT

A module plate is provided for use with a wafer handler and testing mechanism. The module plate has a diameter equivalent to an integrated circuit wafer and a height equivalent to or less than a height of a module lid associated with each module in a plurality of modules associated with the module plate. The module plate has a plurality of cutouts in the module plate that have a width equivalent to a width of the module lid and at least a length equivalent to a length of the (Continued)

module lid. The height of the module plate is such that, when a test head contacts a module base of each module in a plurality of modules, the module lid contacts a chuck on which the module plate resides during testing of the module thereby providing resistance in order to accurately test the module.

18 Claims, 9 Drawing Sheets

(56) References Cited

U.S. PATENT DOCUMENTS

| | | | | | |
|---|---|---|---|---|---|
| 2002/0109518 | A1* | 8/2002 | Saito | | G01R 1/0458 324/750.09 |
| 2002/0195122 | A1* | 12/2002 | Hembree | | H01L 21/67028 134/3 |
| 2003/0102016 | A1* | 6/2003 | Bouchard | | H01L 21/67028 134/32 |
| 2005/0269240 | A1* | 12/2005 | Ikeda | | G01R 31/2893 206/706 |
| 2006/0104692 | A1* | 5/2006 | Nakamura | | G01R 31/2808 400/88 |
| 2007/0026171 | A1* | 2/2007 | Extrand | | B65D 1/36 428/34.1 |
| 2008/0036482 | A1* | 2/2008 | Tomita | | G01R 31/2887 324/750.18 |
| 2009/0053017 | A1* | 2/2009 | Shmuelov | | H01L 21/67017 414/217 |
| 2010/0148808 | A1* | 6/2010 | Butler | | G01R 31/3004 324/750.3 |
| 2013/0214809 | A1* | 8/2013 | Nakamura | | G01R 1/0433 324/756.02 |
| 2014/0354312 | A1* | 12/2014 | Li | | G01R 31/2891 324/750.03 |
| 2015/0185282 | A1* | 7/2015 | Wang | | G01B 31/31851 324/762.02 |
| 2015/0276862 | A1* | 10/2015 | Kikuchi | | G01C 11/00 324/750.25 |
| 2015/0303171 | A1* | 10/2015 | Patten | | H01L 24/97 156/297 |
| 2016/0003869 | A1* | 1/2016 | Matsumura | | G01R 1/0416 324/756.02 |

FOREIGN PATENT DOCUMENTS

| | | |
|---|---|---|
| CN | 102698969 A | 10/2013 |
| CN | 103477237 A | 12/2013 |
| CN | 103558426 A | 2/2014 |
| CN | 203519657 U | 4/2014 |
| TW | 1344187 | 6/2011 |

* cited by examiner

MODULE TESTING UTILIZING WAFER PROBE TEST EQUIPMENT

BACKGROUND

The present application relates generally to an improved data processing apparatus and method and more specifically to mechanisms for testing modules using water probe test equipment.

In accordance with the present invention, a module is a self-contained integrated circuit device. In order to test the components within such a self-contained integrated circuit device, commonly referred to as a module, unit testing is performed by which the module in association with individual units of source code, sets of one or more computer program modules together with associated control data, usage procedures, and/or operating procedures, are tested to determine whether the module operates properly. Current module test systems utilize a separate module board with one or more module test sockets for a module to be inserted within. The module is then inserted into one of the one or more module test sockets on the module board and tested.

SUMMARY

In one illustrative embodiment, a method, in a data processing system, is provided for testing a plurality of modules in a module plate. The illustrative embodiment receives the module plate comprising the plurality of modules. In the illustrative embodiment, the module plate comprises a diameter equivalent to an integrated circuit wafer and a height equivalent to or less than a height of a module lid associated with each module in the plurality of modules associated with the module plate. In the illustrative embodiment, the module plate comprises a plurality of cutouts in the module plate that have a width equivalent to a width of the module lid and at least a length equivalent to a length of the module lid. The illustrative embodiment tests each module in the plurality of modules by contacting the module though a test head that contacts the module base of the module and in relation the module lid of the module contacts a chuck on which the module plate resides thereby providing resistance in order to accurately test the module.

In other illustrative embodiments, a system/apparatus is provided. The system/apparatus may comprise one or more processors and a memory coupled to the one or more processors. The memory may comprise instructions which, when executed by the one or more processors, cause the one or more processors to perform various ones of, and combinations of the operations outlined above with regard to the method illustrative embodiment.

In yet another illustrative embodiment, a module plate for use with a wafer handler and testing mechanism. The module plate comprises a diameter equivalent to an integrated circuit wafer and a height equivalent to or less than a height of a module lid associated with each module in a plurality of modules associated with the module plate. The module plate further comprises a plurality of cutouts in the module plate that have a width equivalent to a width of the module lid and at least a length equivalent to a length of the module lid. The height of the module plate is such that, when a test head contacts a module base of each module in a plurality of modules, the module lid contacts a chuck on which the module plate resides during testing of the module thereby providing resistance in order to accurately test the module.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
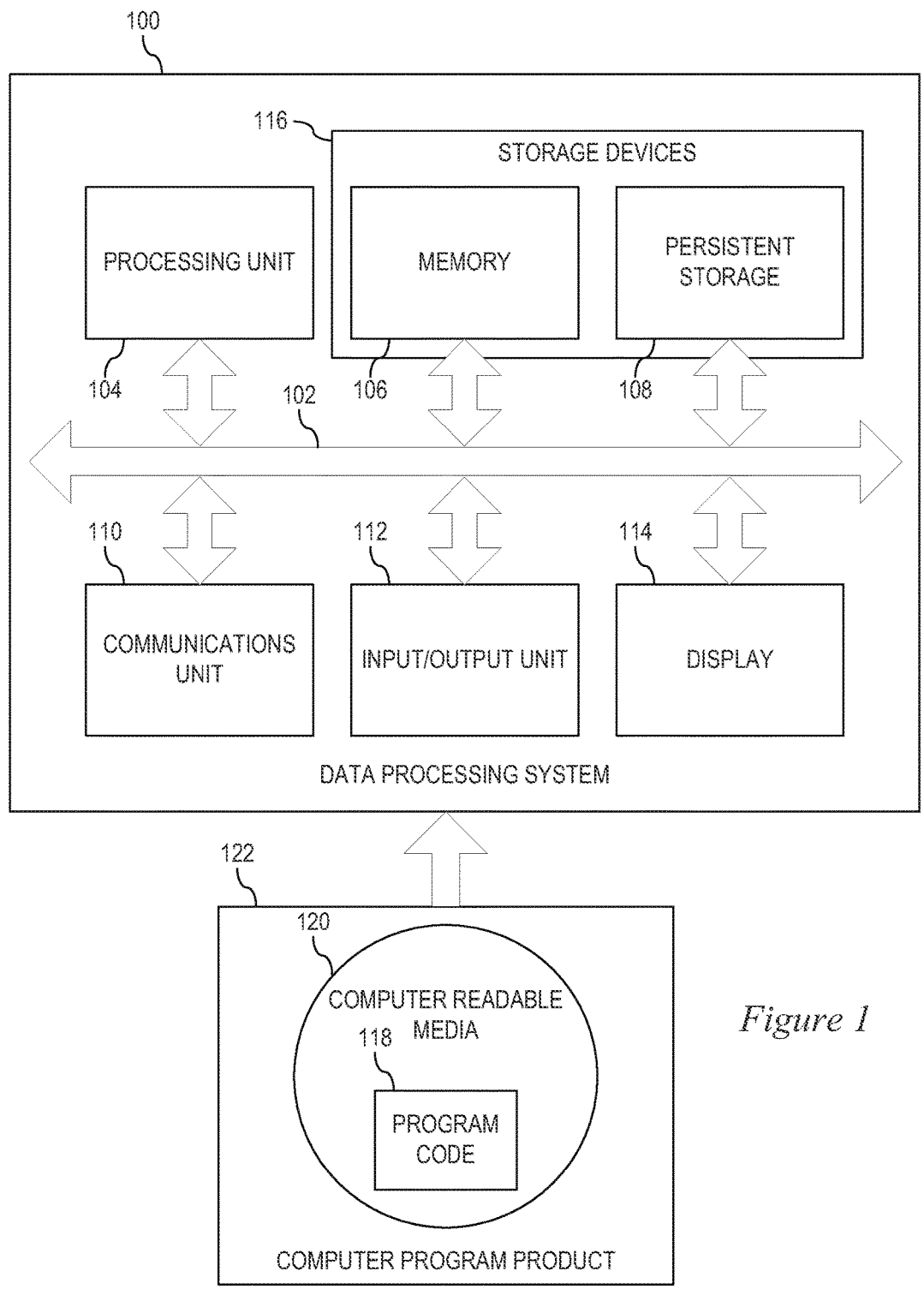
FIG. 1 depicts a block diagram of a data processing system in which illustrative embodiments may be implemented.

In order to provide for a plurality of modules to be automatically tested in parallel or sequentially, the illustrative embodiments provide for repurposing integrated circuit wafer testing equipment to perform module testing. The mechanisms of the illustrative embodiments provide a module plate that is similar in diameter to an integrated circuit wafer but has a height that provides for a set of modules to be inserted into the module plate. A particular module plate has cutouts that are wide enough to hold an associated set of modules with pins up such that each module is supported either on all four sides, on just two sides, or, if the module is an end module, on three sides. The module plate conforms to the diameter of current integrated circuit wafers no that a wafer handler is able to grasp a particular module plate using a "holder profile." Once the module plate is loaded with a set of modules conforming to the size of the cutouts in the module, the wafer handler retrieves the module plate from a wafer storage box and directly places the module plate in a chuck of a testing mechanism for parallel or sequential module testing. Once the testing is complete, the wafer handler removes the module plate from the chuck of the testing mechanism and places the module plate with the set of modules into the wafer storage box for storage. Thus, the illustrative embodiment provides for automatically testing a set of modules utilizing a repurposed integrated circuit wafer testing equipment.

Before beginning the discussion of the various aspects of the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on general purpose hardware, software instructions stored on a medium such that the instructions are readily executable by specialized or general purpose hardware, a procedure or method for executing the functions, or a combination of any of the above.

The present description and claims may make use of the terms "a," "at least one of," and "one or more of" with regard to particular features and elements of the illustrative embodiments. It should be appreciated that these terms and phrases are intended to state that there is at least one of the particular feature or element present in the particular illustrative embodiment, hut that more than one can also be present. That is, these terms/phrases are not intended to limit the description or claims to a single featurelelement being present or require that a plurality of such features/elements be present. To the contrary, these terms/phrases only require at least a single feature/element with the possibility of a plurality of such features/elements being within the scope of the description and claims.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of the examples provided herein without departing from the spirit and scope of the present invention.

Thus, the illustrative embodiments may be utilized in many different types of data processing environments. In order to provide a context for the description of the specific elements and functionality of the illustrative embodiments, FIG. 1 is provided hereafter as an example environment in which aspects of the illustrative embodiments may be implemented. It should be appreciated that FIG. 1 is only an examples and is not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a block diagram of a data processing system in which illustrative embodiments may be implemented. Data processing system 100 is an example of a computer, in which computer usable program code or instructions implementing the processes may be located for the illustrative embodiments. In this illustrative example, data processing system 100 includes communications fabric 102, which provides communications between processor unit 104, memory 106, persistent storage 108, communications unit 110, input/output (I/O) unit 112, and display 114.

Processor unit 104 serves to execute instructions for software that may be loaded into memory 106. Processor unit 104 may be a set of one or more processors or may be a multi-processor core, depending on the particular implementation. Further, processor unit 104 may be implemented using one or more heterogeneous processor systems in which a main processor is present with secondary processors on a single chip. As another illustrative example, processor unit 104 may be a symmetric multi-processor system containing multiple processors of the same type.

Memory 106 and persistent storage 108 are examples of storage devices 116. A storage device is any piece of hardware that is capable of storing information, such as, for example, without limitation, data, program code in functional form, and/or other suitable information either on a temporary basis and/or a permanent basis. Memory 106, in these examples, may be, for example, a random access memory or any other suitable volatile or non-volatile storage device. Persistent storage 108 may take various forms depending on the particular implementation. For example, persistent storage 108 may contain one or more components or devices. For example, persistent storage 108 may be a hard drive, a flash memory, a rewritable optical disk, a rewritable magnetic tape, or some combination of the above. The media used by persistent storage 108 also may be removable. For example, a removable hard drive may be used for persistent storage 108.

Communications unit 110, in these examples, provides for communications with other data processing systems or devices. In these examples, communications unit 110 is a network interface card. Communications unit 110 may provide communications through the use of either or both physical and wireless communications links.

Input/output unit 112 allows for input and output of data with other devices that may be connected to data processing system 100. For example, input/output unit 112 may provide a connection for user input through a keyboard, a mouse, and/or some other suitable input device. Further, input/output unit 112 may send output to a printer. Display 114 provides a mechanism to display information to a user.

Instructions for the operating system, applications, and/or programs may be located in storage devices 116, which are in communication with processor unit 104 through communications fabric 102. In these illustrative examples the instruction are in a functional form on persistent storage 108. These instructions may be loaded into memory 106 for execution by processor unit 104. The processes of the different embodiments may be performed by processor unit 104 using computer implemented instructions, which may be located in a memory, such as memory 106.

These instructions are referred to as program code, computer usable program code, or computer readable program code that may be read and executed by a processor in processor unit 104. The program code in the different embodiments may be embodied on different physical or tangible computer readable media, such as memory 106 or persistent storage 108.

Program code 118 is located in a functional form on computer readable media 120 that is selectively removable and may be loaded onto or transferred to data processing system 100 for execution by processor unit 104. Program code 118 and computer readable media 120 form computer program product 122 in these examples. In one example, computer readable media 120 may be in a tangible form, such as, for example, an optical or magnetic disc that is inserted or placed into a drive or other device that is part of persistent storage 108 for transfer onto a storage device, such as a hard drive that is part of persistent storage 108. In a tangible form, computer readable media 120 also may take the form of a persistent storage, such as a hard drive, a thumb drive, or a flash memory that is connected to data processing system 100. The tangible form of computer readable media 120 is also referred to as computer recordable storage media. In some instances, computer readable media 120 may not be removable.

Alternatively, program code 118 may be transferred to data processing system 100 from computer readable media 120 through a communications link to communications unit 110 and/or through a connection to input/output unit 112. The communications link and/or the connection may be physical or wireless in the illustrative examples. The computer readable media also may take the form of non-tangible media, such as communications links or wireless transmissions containing the program code.

In some illustrative embodiments, program code 118 may be downloaded over a network to persistent storage 108 from another device or data processing system for use within data processing system 100. For instance, program code stored in a computer readable storage medium in a server data processing system may be downloaded over a network from the server to data processing system 100. The data processing system providing program code 118 may be a server computer, a client computer, or some other device capable of storing and transmitting program code 118.

The different components illustrated for data processing system 100 are not meant to provide architectural limitations to the manner in which different embodiments may be implemented. The different illustrative embodiments may be implemented in a data processing system including components in addition to or in place of those illustrated for data processing system 100. Other components shown in FIG. 1 can be varied from the illustrative examples shown. The different embodiments may be implemented using any hardware device or system capable of executing program code. As one example, the data processing system may include organic components integrated with inorganic components and/or may be comprised entirely of organic components excluding a human being. For example, a storage device may be comprised of an organic semiconductor.

As another example, a storage device in data processing system 100 is any hardware apparatus that may store data. Memory 106, persistent storage 108, and computer readable media 120 are examples of storage devices in a tangible form.

In another example, a bus system may be used to implement communications fabric 102 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 106 or a cache such as found in an interface and memory controller hub that may be present in communications fabric 102.

Figure 2:
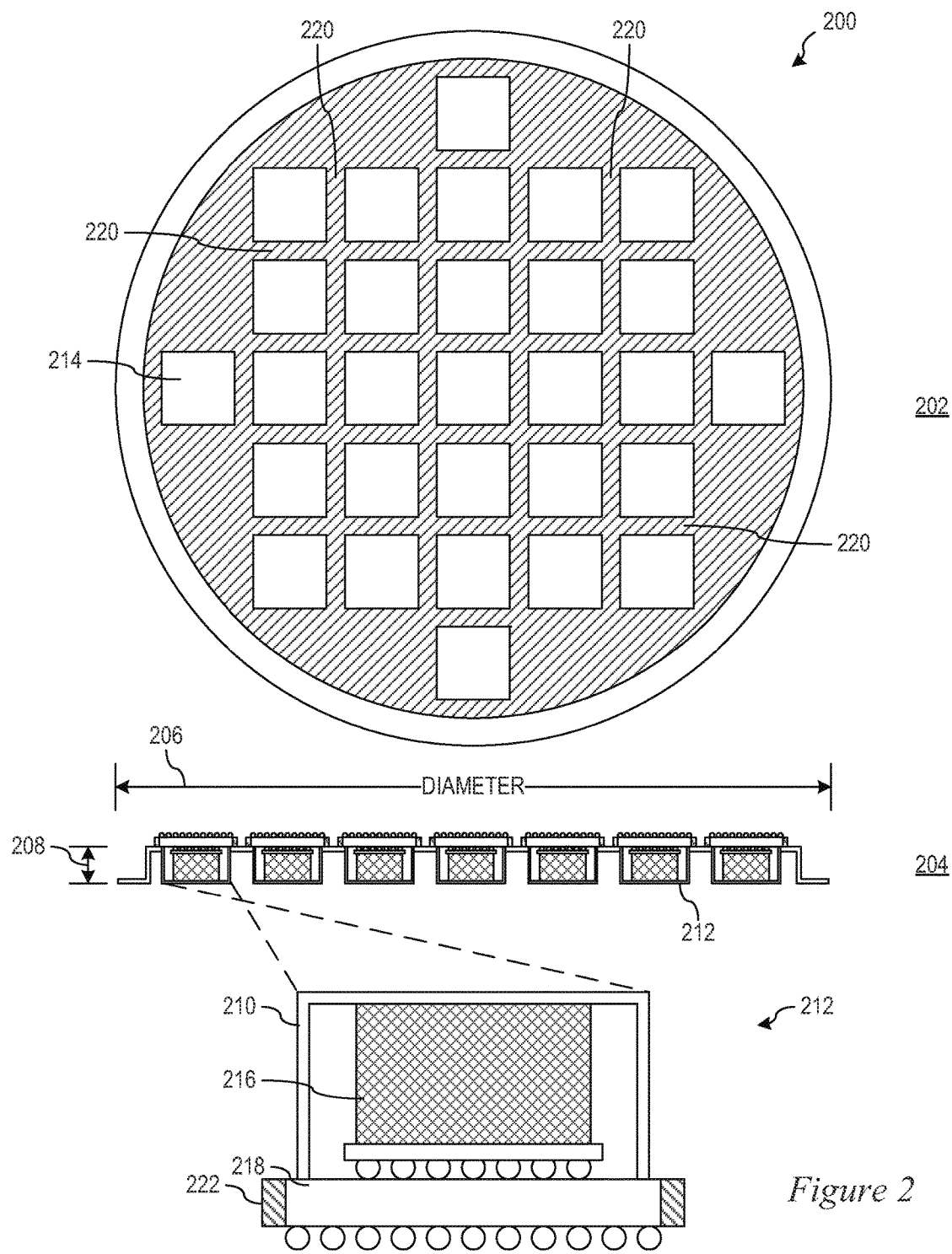
FIG. 2 depicts one exemplary illustration of a module plate in accordance with an illustrative embodiment.

As stated previously, in order to provide for a plurality of modules to be automatically tested in parallel or sequentially, the illustrative embodiments provide for repurposing integrated circuit wafer testing equipment to perform module testing utilizing a module plate that is similar in diameter to an integrated circuit wafer but has a height that provides for a set of modules to be inserted into the module plate. FIG. 2 depicts one exemplary illustration of a module plate in accordance with an illustrative embodiment. FIG. 2 depicts the exemplary module plate 200 in both overhead vim 202 and side view 204. Module plate 200 may be comprised of any anti-static light-weight material, such as aluminum, carbon, or the like. Module plate 200 has a diameter 206 that conforms to the diameter of current integrated circuit wafers so that a wafer handler is able to grasp module plate 200 in a similar fashion to that when the wafer handler grasps an integrated circuit wafer. However, in difference to the height of a wafer, module plate 200 has a height 208 that is equivalent to or less than the height of the module lid 210 of modules 212, which is the portion of the module that is inserted into a cutout 214 in the module plate 200. While the term "module lid" may be confusing to those who are not skilled in the art since the module lid is depicted on the bottom of the each of modules 212, one of ordinary skill in the art would realize that each of modules 212 is formed by placing an integrated circuit chip 216 onto a module base 218 so that the C4 balls of the integrated circuit chip 216 make electrical contact with the pads on the module base 218. While the illustrative embodiments utilize the term module base, one of ordinary skill in the art may also refer to a module base as a "chip carrier" or "substrate." The module lid 210 is placed over the integrated circuit chip 216 and couples to the module base 218, such that the integrated circuit chip 216 maintains electrical contact with the module base 218. Then, when module 212 is inserted into a cutout 214 in the module plate 200, the module 212 is inverted so that the module lid 210 protrudes through cutout 214 and the module base 218 rests on all four rails 220 on module plate 200, which surrounds each of cutouts 214.

In order for the module base 218 to rest on rails 220 on module plate 200, module base 218 comprises a module ring 222 that surrounds the module base 218, which may be a natural part of the module base 218 or an added component to module base 218. As depicted in overhead view 202, rails 220 surround each of cutouts 214, such that in the exemplary module plate 200 when a module 212 is inserted into a cutout 214, the module base 218 of the module 212 rests on all four of rails 220 that surround the cutout 214. As is further illustrated, the module base 218 comprises its own set of C4 balls that, when the module 212 is inverted, face upward so as to provide a point of contact for later module testing.

Thus, exemplary module plate 200 comprises a plurality of cutouts 214 that are each surrounded by rails 220 in order that each module 212 is supported on four sides. The height 208 of module plate 200 is dependent on the specific module being tested since it is important that the height 208 be equivalent to or less than the height of the module lid 210 of module 212. The height is important so that, when the wafer handler places the module plate 200 in a testing mechanism, each of modules 212 make contact with a chuck of the testing mechanism. Thus, when a test socket of the testing mechanism makes contact with the C4 balls of the module base 218, good thermal contact is made between the module lid 210 and the chuck of the testing mechanism.

Figure 3:
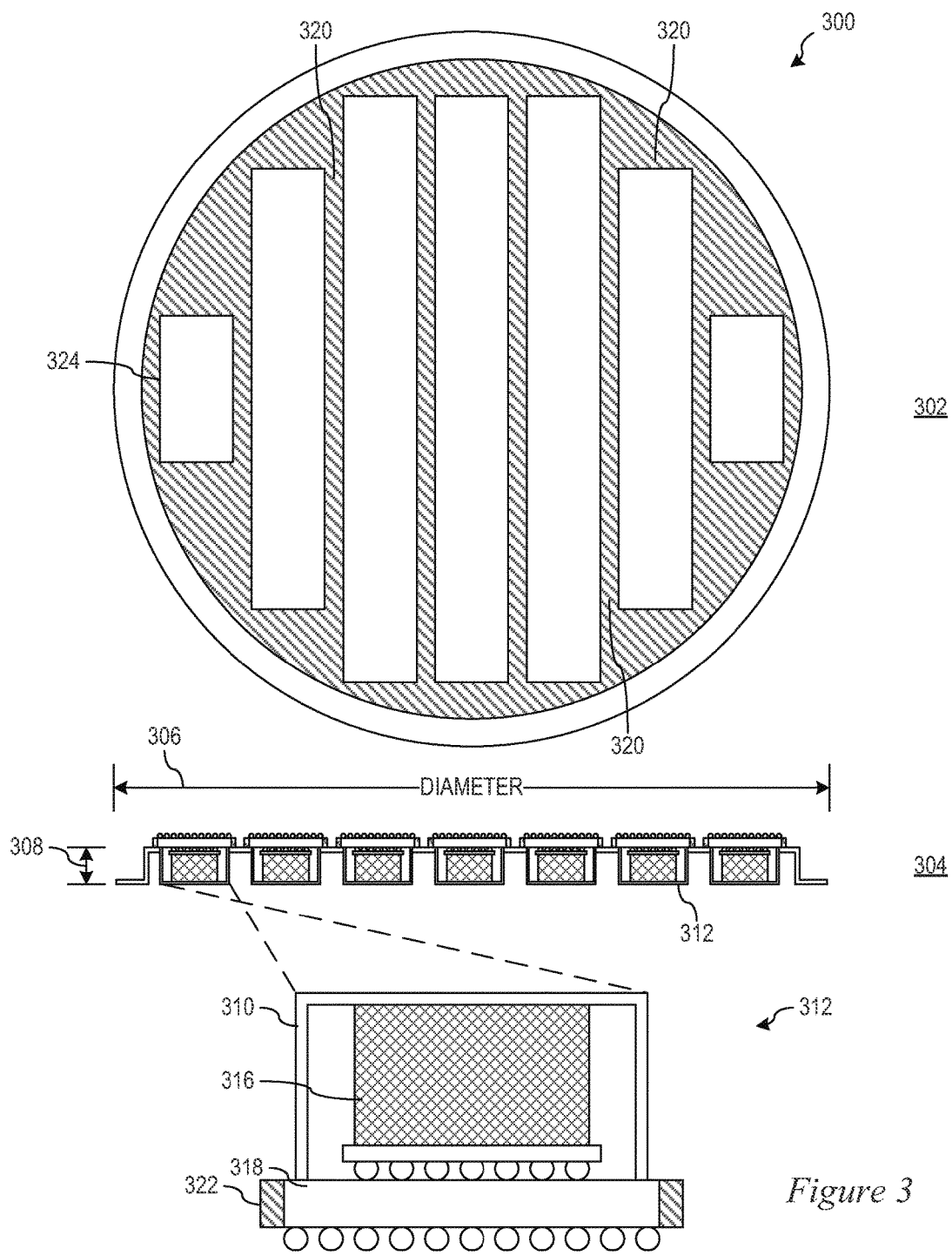
FIG. 3 depicts another exemplary illustration of a module plate in accordance with an illustrative embodiment.

FIG. 3 depicts another exemplary illustration of a module plate in accordance with an illustrative embodiment. FIG. 3 depicts the exemplary module plate 300 in both an overhead view 302 and a side view 304 and differs from the module plate 200 in FIG. 2 in that, instead of having individual cutouts 214 for each of modules 212, module plate 300 has rectangular cutouts 324. Rectangular cutouts 324 are fashioned so that multiple modules 312 may be inserted in each of cutouts 324 such that modules 312 are side-by-side and the module base 318 of each module 312 rests on two to three of rails 320 that surround the rectangular cutout 324. That is, if a module 312 is one of the end modules within rectangular cutout 324, then the module 312 will rest on two of side rails 320 and an end rail 320. However, if a module 312 is one of a module in between the end modules within rectangular cutout 324, then the module 312 will rest on just the two side rails 320.

Similar to the description of module 200 in FIG. 2, module 300 has a diameter 306 that conforms to the diameter of current integrated circuit wafers so that a wafer handler is able to grasp module plate 300 in a similar fashion to that when the wafer handler grasps an integrated circuit wafer. Further, module plate 300 has a height 308 that is equivalent to or less than the height of the module lid 310 of modules 312, which is the portion of the module that is inserted into a rectangular cutout 324 in the module plate 300. Module lid 310 has a similar meaning to that of module lid 210 described in detail with regard to FIG. 2. That is, each of modules 312 is formed by placing an integrated circuit chip 316 onto a module base 318 so that the C4 balls of the integrated circuit chip 316 make electrical contact with the pads on the module base 318. The module lid 310 is placed over the integrated circuit chip 316 and couples to the module base 318, such that the integrated circuit chip 316 maintains electrical contact with the module base 318. Then, when module 312 is inserted into a rectangular cutout 324 in the module plate 300, the module 312 is inverted so that the module lid 310 protrudes through rectangular cutout 324 and the module base 318 rests on all four rails 320 on module plate 300, which surrounds each of cutouts 324.

In order for the module base 318 to rest on two or more rails 320 on module plate 300, module base 318 comprises a module ring 322 that surrounds the module base 318, which may be a natural part of the module base 318 or an added component to module base 318. As depicted in overhead view 302, rails 320 surround each of rectangular cutouts 324, such that in the exemplary module plate 300 when a module 312 is inserted into a rectangular cutout 324, the module base 318 of the module 312 will rest on two or three of rails 320 that surround the rectangular cutout 324. Further, the module base 318 comprises its own set of C4 balls that, when the module 312 is inverted, face upward so as to provide a point of contact for later module testing.

Thus, exemplary module plate 300 comprises a plurality of rectangular cutouts 324 that surround two or more modules 312, which support each module on two or three sides. The height 308 of module plate 300 is dependent on the specific module being tested since it is important that the height 308 be equivalent to or less than the height of the module lid 310 of module 312. The height is important so that, when the wafer handler places the module plate 300 in a testing mechanism, each of modules 312 make contact with a chuck of the testing mechanism. Thus, when a test socket of the testing mechanism makes contact with the C4 balls of the module base 318, module lid 310 makes good thermal contact with the chuck of the testing mechanism.

As would be evident to one of ordinary skill in the art, the illustrative embodiments recognize that a combination of individual cutouts, such as cutouts 214 of FIG. 2, and rectangular cutouts, such as rectangular cutouts 324 of FIG. 3, may reside on any one particular module plate. That is, depending on the surface area of the raised portion of the module plate and the dimensions of a module that will be utilized with the module plate, the illustrative embodiments intend to utilize as much surface area as possible in order to fit as many modules as possible while still provide adequate support to the module base associated with each of the modules inserted into the cutouts.

Figure 4:
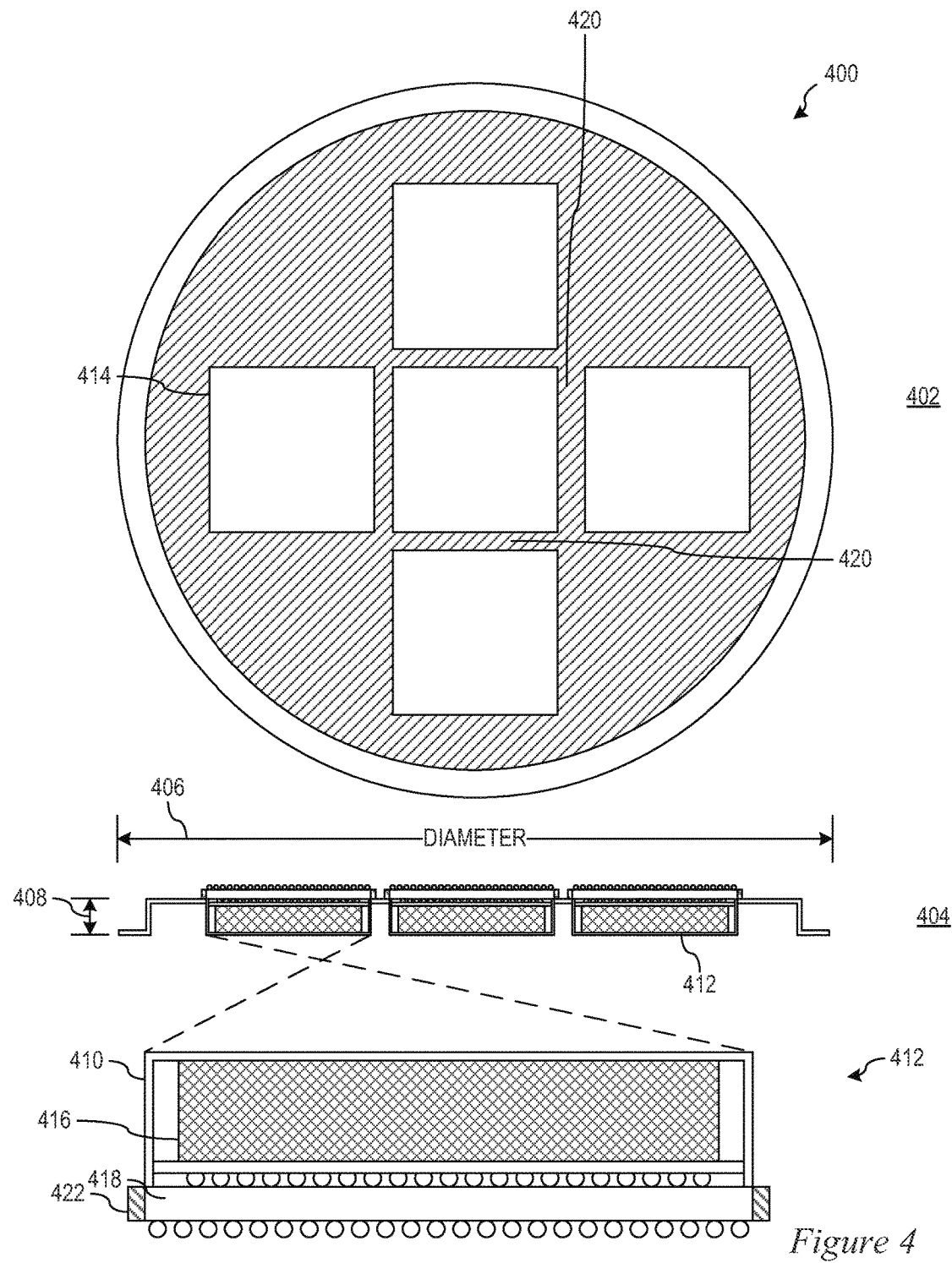
FIGS. 4 and 5 depict module plates in which larger modules may be inserted in accordance with illustrative embodiments.
Figure 5:
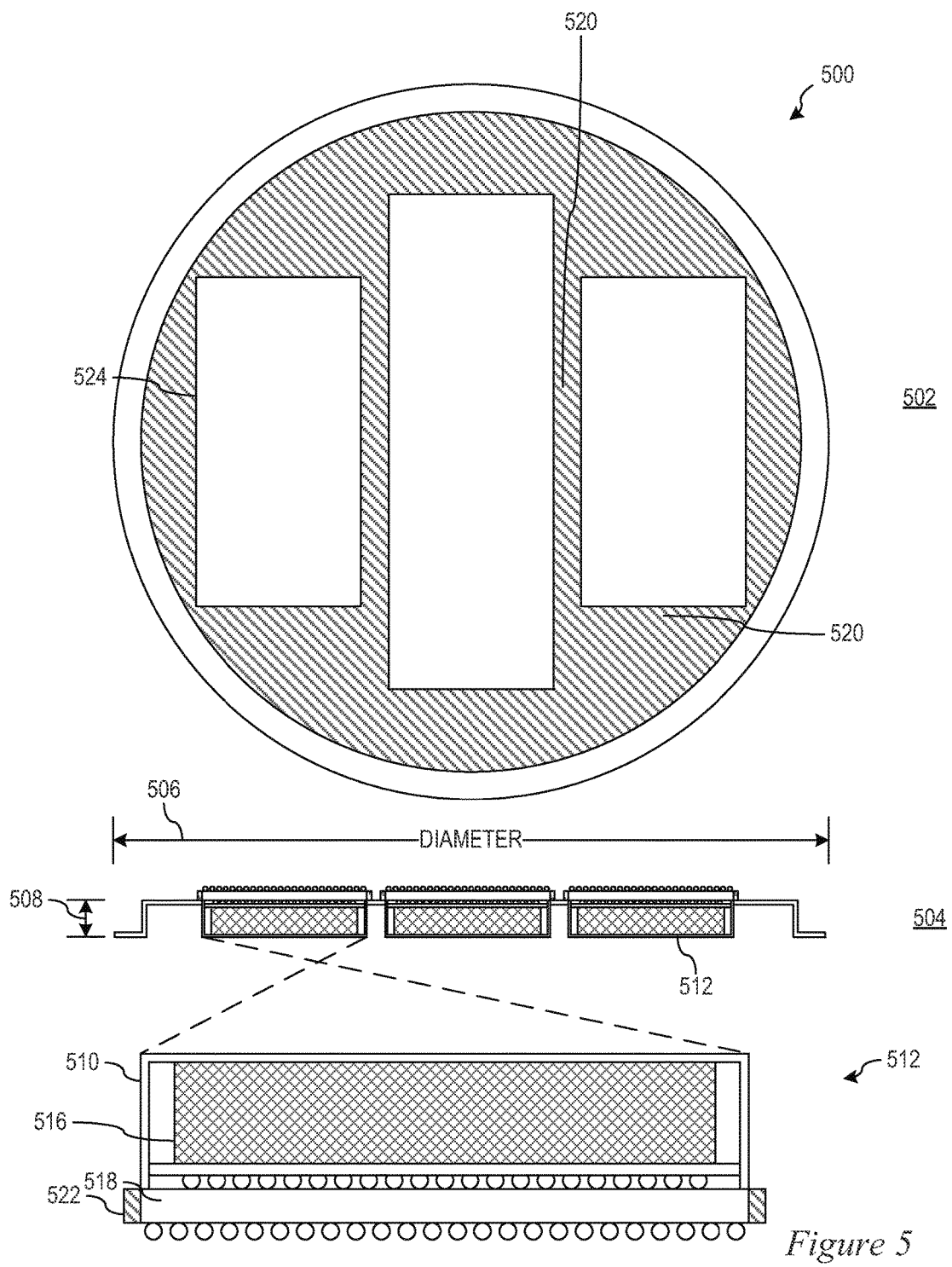

In order to illustrate that the above exemplified module plates may differ depending on the module size, FIGS. 4 and 5 depict module plates in which larger modules may be inserted in accordance with illustrative embodiments. FIG. 4 depicts the exemplary module plate 400 in both overhead view 402 and side view 404. Module plate 400 has a diameter 406 that conforms to the diameter of current integrated circuit wafers so that a wafer handler is able to grasp module plate 400 in a similar fashion to that when the wafer handler grasps an integrated circuit wafer. However, in difference to the height of a wafer, module plate 400 has a height 408 that is equivalent to or less than the height of the module lid 410 of modules 412, which is the portion of the module that is inserted into a cutout 414 in the module plate 400. Module lid 410 has a similar meaning to that of module lid 210 described in detail with regard to FIG. 2. That is, each of modules 412 is formed by placing an integrated circuit chip 416 onto a module base 418 so that the C4 balls of the integrated circuit chip 416 make electrical contact with the pads on the module base 418. The module lid 410 is placed over the integrated circuit chip 416 and couples to the module base 418, such that the integrated circuit chip 416 maintains electrical contact with the module base 418. Then, when module 412 is inserted into a cutout 414 in the module plate 400, the module 412 is inverted so that the module lid 410 protrudes through cutout 414 and the module base 418 rests on all four rails 420 on module plate 400, which surrounds each of cutouts 414.

In order for the module base 418 to rest on rails 420 on module plate 400, module base 418 comprises a module ring 422 that surrounds the module base 418, which may be a natural part of the module base 418 or an added component to module base 418. As depicted in overhead view 402, rails 420 surround each of cutouts 414, such that in the exemplary module plate 400 when a module 412 is inserted into a cutout 414, the module base 418 of the module 412 will rest on all four of rails 420 that surround the cutout 414. As is further illustrated, the module base 418 comprises its own set of C4 balls that, when the module 412 is inverted, face upward so as to provide a point of contact for later module testing.

Thus, exemplary module plate 400 comprises a plurality of cutouts 414 that are each surrounded by rails 420 in order that each module 412 is supported on four sides. The height 408 of module plate 400 is dependent on the specific module being tested since it is important that the height 408 be equivalent to or less than the height of the module lid 410 of module 412. The height is important so that, when the wafer handler places the module plate 400 in a testing mechanism, each of modules 412 make contact with a chuck of the testing mechanism. Thus, when a test socket of the testing mechanism makes contact with the C4 balls of the module base 418, good thermal contact is made between the module lid 410 and the chuck of the testing mechanism.

FIG. 5 depicts the exemplary module plate 500 in both an overhead view 502 and a side view 504 and differs from the module plate 400 in FIG. 4 in that, instead of having individual cutouts 414 for each of modules 412, module plate 500 has rectangular cutouts 524. Rectangular cutouts 524 are fashioned so that multiple modules 512 may be inserted each of cutouts 524 such that modules 512 are side-by-side and the module base 518 of each module 512 rests on two to three of rails 520 that surround the rectangular cutouts 524. That is, if a module 512 is one of the end modules within rectangular cutouts 524, then the module 512 will rest on two of side rails 520 and an end rail 520. However, if a module 512 is a module in between the end modules within rectangular cutouts 524, then the module 512 will rest on just the two side rails 520.

Similar to the description of module 400 in FIG. 4, module 500 has a diameter 506 that conforms to the diameter of current integrated circuit wafers so that a wafer handler is able to grasp module plate 500 in a similar fashion to that when the wafer handler grasps an integrated circuit wafer. Further, module plate 500 has a height 508 that is equivalent to or less than the height of the module lid 510 of modules 512, which is the portion of the module that is inserted into rectangular cutouts 524 in the module plate 500. Module lid 510 has a similar meaning to that of module lid 210 described in detail with regard to FIG. 2. That is, each of modules 512 is formed by placing an integrated circuit chip 516 onto a module base 518 so that the C4 balls of the integrated circuit chip 516 make electrical contact with the pads on the module base 518. The module lid 510 is placed over the integrated circuit chip 516 and couples to the module base 518, such that the integrated circuit chip 516 maintains electrical contact with the module base 518. Then, when module 512 is inserted into rectangular cutouts 524 in the module plate 500, the module 512 is inverted so that the module lid 510 protrudes through rectangular cutouts 524 and the module base 518 rests two or three of rails 520 on module plate 500, which surrounds each of rectangular cutouts 524.

In order for the module base 518 to rest on two or three of rails 520 on module plate 500, module base 518 comprises a module ring 522 that surrounds the module base 518, which may be a natural part of the module base 518 or an added component to module base 518. As depicted in overhead view 502, rails 520 surround each of rectangular cutouts 524, such that in the exemplary module plate 500 when a module 512 is inserted into rectangular cutouts 524, the module base 518 of the module 512 will rest on two or three of rails 520 that surround the rectangular cutouts 524. Further, the module base 518 comprises its own set of C4 balls that, when the module 512 is inverted, face upward so as to provide a point of contact for later module testing.

Thus, exemplary module plate 500 comprises a plurality of rectangular cutouts 524 that surround one or more modules 512, which support each module 512 on three or more sides. The height 508 of module plate 500 is dependent on the specific module being tested since it is important that the height 508 be equivalent to or less than the height of the module lid 510 of module 512. The height is important so that, when the wafer handler places the module plate 500 in a testing mechanism, each of modules 512 make contact with a chuck of the testing mechanism. Thus, when a test socket of the testing mechanism makes contact with the C4 balls of the module base 518, module lid 510 makes good thermal contact with the chuck of the testing mechanism.

Figure 6:
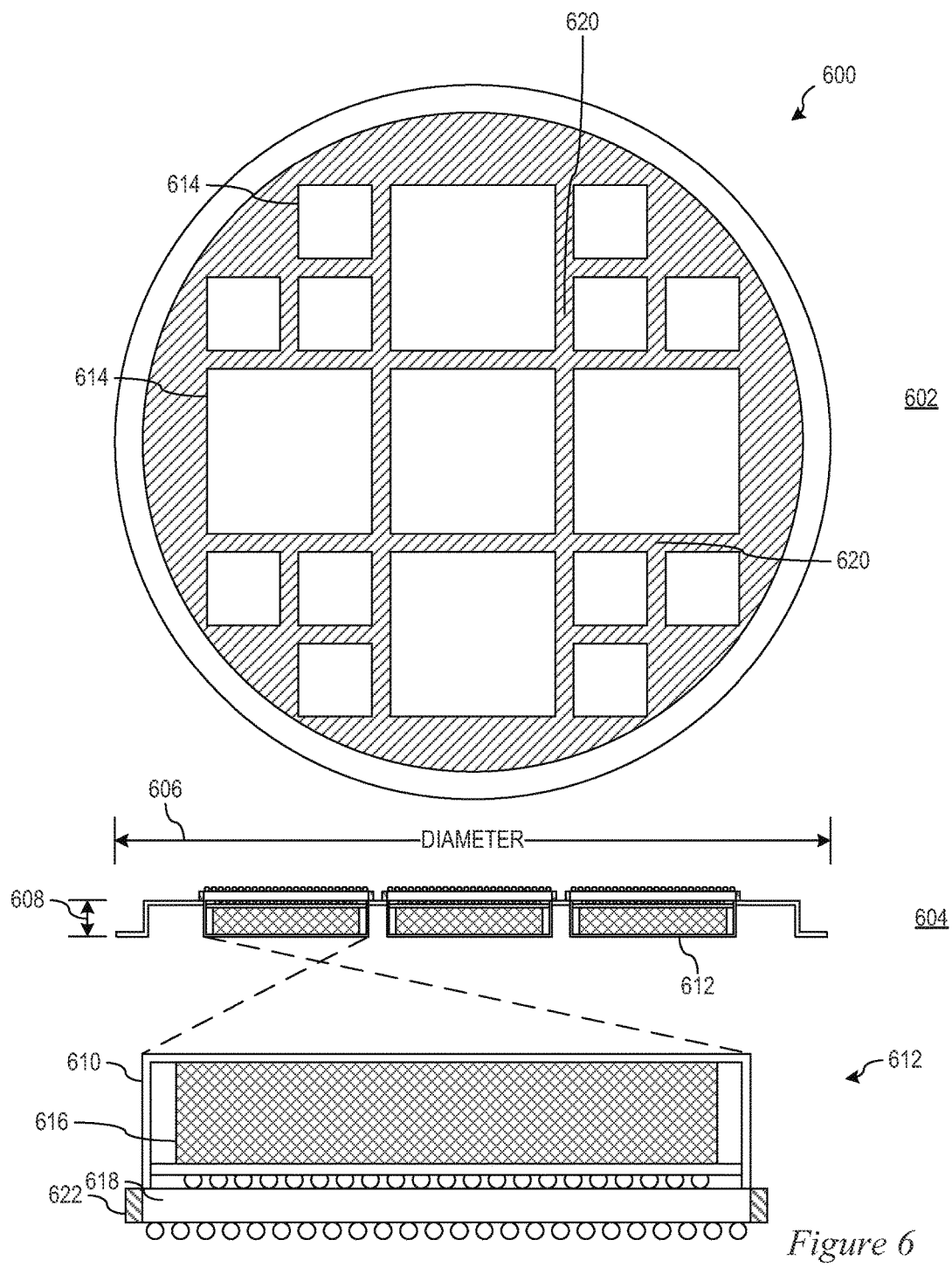
FIG. 6 depicts a module plate in which different sized modules may be inserted in accordance with illustrative embodiments.

In addition to the above exemplified module plates, a further extension of the illustrative embodiment includes, as depicted in FIG. 6, a module plate that houses different sized modules on the same module plate in accordance with the illustrative embodiments. FIG. 6 depicts the exemplary module plate 600 in both overhead view 602 and side view 604. Module plate 600 has a diameter 606 that conforms to the diameter of current integrated circuit wafers so that a wafer handler is able to grasp module plate 600 in a similar fashion to that when the wafer handler grasps an integrated circuit wafer. However, difference to the height of a wafer, module plate 600 has a height 608 that is equivalent to or less than the height of the module lid 610 of modules 612, which is the portion of the module that is inserted into a cutout 614 in the module plate 600. Module lid 610 has a similar meaning to that of module lid 210 described in detail with regard to FIG. 2. That is, each of modules 612 is formed by placing an integrated circuit chip 616 onto a module base 618 so that the C4 balls of the integrated circuit chip 616 make electrical contact with the pads on the module base 618. The module lid 610 is placed over the integrated circuit chip 616 and couples to the module base 618, such that the integrated circuit chip 616 maintains electrical contact with the module base 618. Then, when module 612 is inserted into a cutout 614 in the module plate 600, the module 612 is inverted so that the module lid 610 protrudes through cutout 614 and the module base 618 rests on all four rails 620 on module plate 600, which surrounds each of cutouts 614.

In order for the module base 618 to rest on rails 620 on module plate 600, module base 618 comprises a module ring 622 that surrounds the module base 618, which may be a natural part of the module base 618 or an added component to module base 618. As depicted in overhead view 602, rails 620 surround each of cutouts 614, such that in the exemplary module plate 600 when a module 612 is inserted into a cutout 614, the module base 618 of the module 612 will rest on all four of rails 620 that surround the cutout 614. As is further illustrated, the module base 618 comprises its own set of C4 balls that, when the module 612 is inverted, face upward so as to provide a point of contact for later module testing.

Thus, exemplary module plate 600 comprises a plurality of cutouts 614 of different sizes that are each surrounded by rails 620 in order that each module 612 is supported on four sides. The height 608 of module plate 600 is dependent on the specific module being tested since it is important that the height 608 be equivalent to or less than the height of the module lid 610 of module 612. The height is important so that, when the wafer handler places the module plate 600 in a testing mechanism, each of modules 612 make contact with a chuck of the testing mechanism. Thus, when a test socket of the testing mechanism makes contact with the C4 balls of the module base 618, good thermal contact is made between the module lid 610 and the chuck of the testing mechanism.

Figure 8:
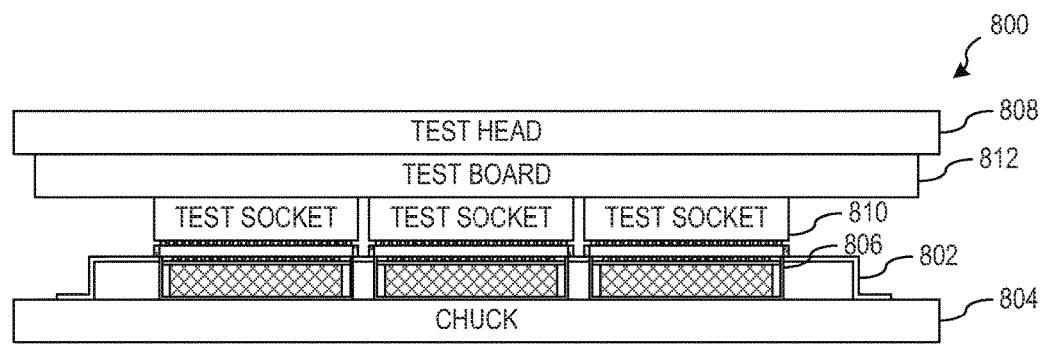
FIG. 8 depicts one exemplary illustration of a module plate being directly placed onto a chuck of a testing mechanism for parallel module testing in accordance with an illustrative embodiment.
Figure 9:
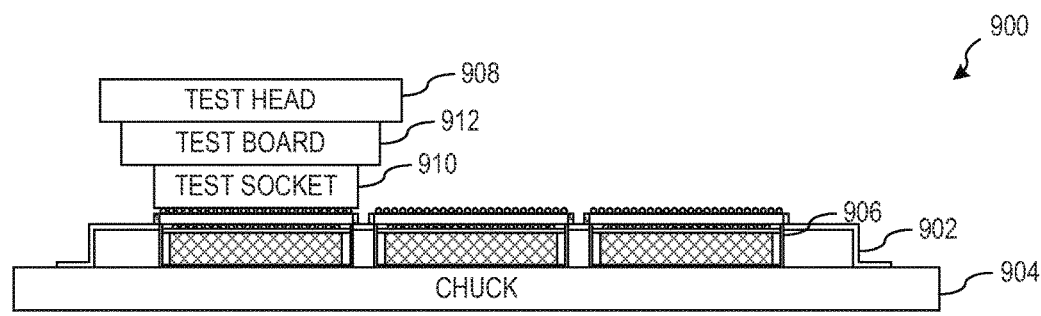
FIG. 9 depicts one exemplary illustration of a module plate being directly placed onto a chuck of a testing mechanism for parallel module testing in accordance with an illustrative embodiment.

While not illustrated in FIG. 6, since modules of different sizes may be placed next to each other, special spacing requirements may be required, such that rails 620 between similar sized modules 612 would be of one dimension while rails 620 between dissimilar sized modules 612 would be of another dimension (i.e. large in order to support the test board contactor space requirements as is described in relation to FIGS. 8 and 9 that follow. Having rails 620 of another dimension between dissimilar sized modules 612 may be important when performing parallel testing of dissimilar sized modules 612 to account for test heads of dissimilar sizes. While FIG. 6 only depicts modules of two different sizes, the illustrative embodiments are not limited to only two different sizes of modules. That is, the illustrative embodiments envision module plates that may handle any number of different sized modules up to the capacity of the particular module plate.

Thus, FIGS. 2-6 provide only a few examples of module plates that can be utilized to hold modules for module testing. As is illustrated and envisioned by the illustrative embodiments, any one particular module plate has cutouts that are wide enough to hold an associated set of module with pins up such that the module is supported either on all four sides, on just two sides, or, if the module is an end module, on three sides.

Figure 7:
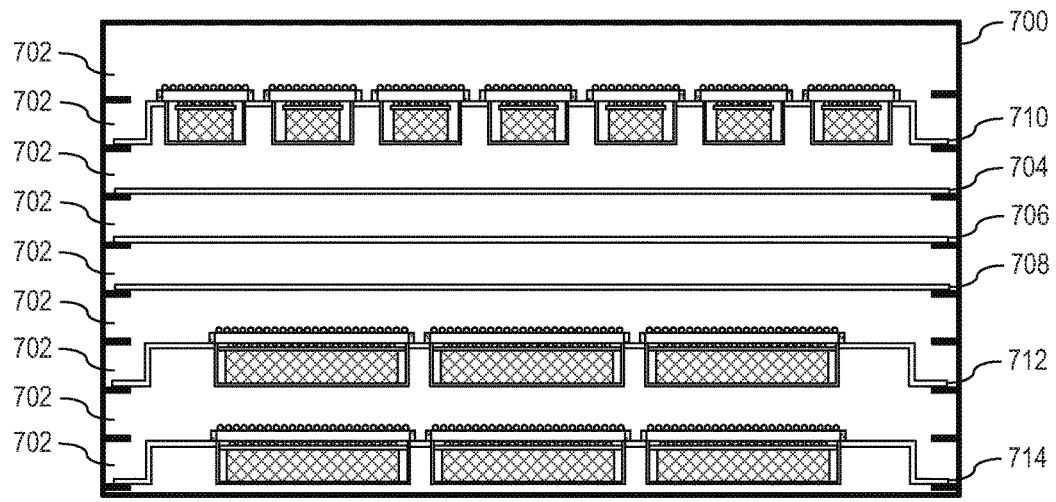
FIG. 7 depicts one illustration of how a wafer storage box may be utilized to store a module plate in accordance with an illustrative embodiment.

In order to illustrate how modules in any one of module plates 200, 300, 400, 500, or 600 of FIG. 2-6, respectively, may be tested, FIGS. 7-9 depict exemplary illustrations of storage of module plates with modules as well as testing of modules within an exemplary module plate in parallel and synchronously in accordance with an illustrative embodiment. As stated earlier, once a module plate is loaded with a set of modules conforming to the size of the cutouts in the module, a wafer handler may either place the module plate with the set of modules into a wafer storage box for storage, or directly place the module plate in a chuck of a testing mechanism for parallel or sequential module testing. FIG. 7 depicts one illustration of how a wafer storage box may be utilized to store a module plate, such as one or more of module plates 200, 300, 400, 500, or 600 of FIGS. 2-6, respectively, in accordance with an illustrative embodiment. Wafer storage box 700 comprises a plurality of slots 702 into which a wafer, such as wafers 704-708 would normally be inserted. However, in accordance with the illustrative embodiments, two or more slots would be utilized to store any one module plate, such as modules plates 710-714. Therefore, in accordance with the illustrative embodiments, an improvement will be required with the interaction of the wafer handler with the module plate as the wafer handler will require sensors to not only recognize the particular one of slots 702 in wafer storage box 700 where the module plate is being inserted, but also the number of slots 702 in wafer storage box 700 that are utilized to store the particular module plate, i.e. two, three, four, etc. Thus, an existing wafer storage box, such as wafer storage box 700, may be repurposed to store modules plate in addition to wafer and no specialized module plate archive would be required.

FIG. 8 depicts one exemplary illustration of a module plate being directly placed onto a chuck of a testing mechanism for parallel module testing in accordance with an illustrative embodiment. As is illustrated, in module testing environment 800, a wafer handler retrieves a module plate from a wafer storage box and places module plate 802 onto chuck 804, which provides the needed cooling and/or heating for the each of modules 806 residing in module plate 802. Either prior to or when module testing commences, test head 808 may use one or more of an electrical, mechanical, and/or optical alignment mechanism to align each of test sockets 810 with modules 806. In order to properly align test head 808 with module plate 802, module plate 802 has an indicator (not shown) that indicates where the origin of module plate 802 is. For example, module plate 802 may have a notch, mark, protrusion, or the like on the outer edge of module plate 802 indicating the orientation/origin. Once aligned, test head 808 lowers so that test sockets 810 make contact with the C4 balls of the module base associated with each of modules 806. As stated previously, when test sockets 810 make contact with modules 806, modules 806 make contact with chuck 804 so that good then contact is made. Once test head 808 ensures contact with modules 806 through test sockets 810, parallel testing of modules 806 commences via test board 812 and test sockets 810. Once an indication of completed testing is received, test head 808 raises and the wafer handler may return module plate 802 to the wafer storage box or move the module plate 802 to a module removal mechanism for module removal. Thus, the illustrative embodiment provides for automatically testing modules 806 in module plate 802 in parallel utilizing a repurposed integrated circuit wafer testing equipment.

FIG. 9 depicts one exemplary illustration of a module plate being directly placed onto a chuck of a testing mechanism for parallel module testing in accordance with an illustrative embodiment. As is illustrated, in module testing environment 900, a wafer handler retrieves a module plate from a wafer storage box and places module plate 902 onto chuck 904, which provides the needed cooling and/or heating for the each of modules 906 residing in module plate 902. Either prior to or when module testing commences, test head 908 may use one or more of an electrical, mechanical, and/or optical alignment mechanism to align test socket 910 to a first module of modules 906. In order to property align test head 908 with module plate 902, module plate 902 has an indicator (not shown) that indicates where the origin of module plate 902 is. For example, module plate 902 may have a notch, mark, protrusion, or the like on the outer edge of module plate 902 indicating the orientation/origin. Once aligned, test head 908 lowers so that test socket 910 makes contact with the C4 balls of the module base associated with the first modules 906. As stated previously, when test socket 910 makes contact with the first and each subsequent one of modules 906, each module 906 make contact with chuck 904 so that good thermal contact is made. Once test head 908 ensures contact with the first module 906 through test socket 910, synchronous testing of each of modules 906 commences via test board 912 and test socket 910, moving from one module to the next until all of modules 906 are tested. Once an indication of completed testing is received, test head 908 raises and the wafer handler may return module plate 902 to the wafer storage box or move the module plate 902 to a module removal mechanism for module removal. Thus, the illustrative embodiment provides for automatically testing modules 906 in module plate 902 synchronously utilizing a repurposed integrated circuit wafer testing equipment.

Therefore, the present invention may be a module plate that holds a set of modules, an apparatus that test a set of modules in a module plate either in parallel or synchronously, a method of testing a set of modules in a module plate either in parallel or synchronously, and/or a computer program product for testing a set of modules in a module plate either in parallel or synchronously. The computer program product may include a computer readable storage medium (or media) having computer readable program instructions thereon for causing a processor to carry out testing of a set of modules in a module plate either in parallel or synchronously.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media e.g., tight pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 10:
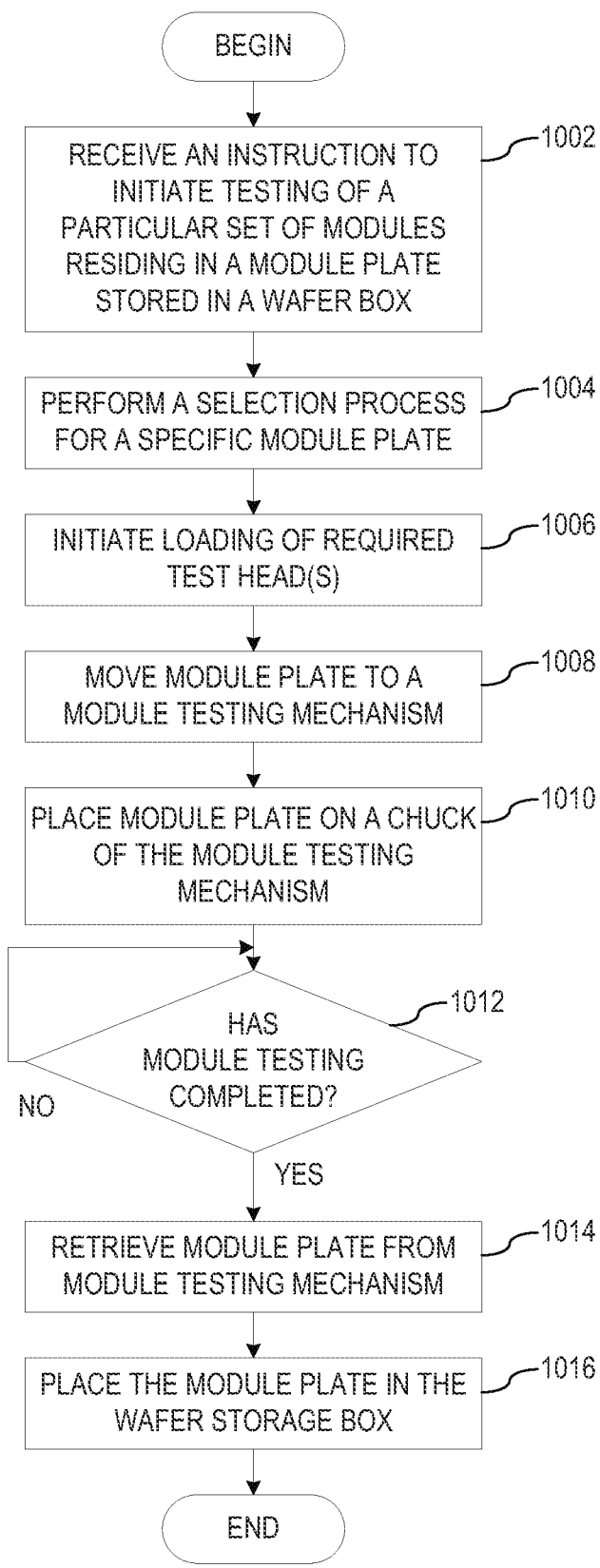
FIG. 10 depicts a function block diagram of the operation performed by a wafer handler in handling a module plate in accordance with an illustrative embodiment.

FIG. 10 depicts a function block diagram of the operation performed by a wafer handler in handling a module plate in accordance with an illustrative embodiment. As the operation begins, a wafer handler receives an instruction to initiate testing of a particular set of modules residing in a module plate stored in a wafer box (step 1002). Based on the received instruction, the wafer handler performs a selection process whereby the wafer prober selects the specific module plate comprising the particular set of modules from a set of module plates in the wafer box (step 1004). In either a concurrent or subsequent process, the wafer handler also initiates a signal to a testing mechanism that will execute the test, so that the correct test board(s) is/are loaded for testing the particular set of modules (step 1006). As illustrated in FIG. 2-5, the exemplary modules plates comprise modules all of the same type thus, based on the particular set of modules to be tested, only one test head will be loaded by the testing mechanism. However, as illustrated in FIG. 6, the exemplary module plate may comprise modules of different types thus, based on the particular set of modules to be tested, the testing mechanism will need to either load two different test heads concurrently or load a first test head and perform testing on the modules of the first type and then load a second test head and perform testing on the modules of the second. In accordance with the illustrative embodiments, a similar operation may be performed for modules and module plates that contain three or more different type/sizes of modules.

From step 1006, the wafer handler uses a "holder profile" to pick up the module plate and moves the module plate to a testing mechanism (step 1008) and places the module plate on a chuck of the testing mechanism (step 1010). In placing the module plate on the chuck, the wafer handler may, in one illustrative embodiment, align the modules with the test head if the test head is a fixed test head. This may be performed by the testing mechanism using one or more of an electrical, mechanical, and/or optical alignment mechanism to identify the location of the module plate and/or modules in the module plate and providing instructions to the wafer handler that instruct the wafer handler to move the module plate in one or more directions. In another illustrative embodiment, the wafer handler may place the module plate at a specific location on the chuck and the testing mechanism may adjust the test head so that the test head aligns with the modules on the module plate using one or more of an electrical, mechanical, and/or optical alignment mechanism.

The wafer handler then performs other tasks until such time as an indication is received indicating that testing of the modules on the module plate in the testing mechanism is complete. Thus, wafer handler determines whether module testing has completed (step 1012). If at step 1012 module testing has failed to complete, the operation returns to step 1012. If at step 1012 module testing has completed, the wafer handler uses the "holder profile to retrieve the module place from the chuck of the testing mechanism (step 1014) and place the module plate the wafer storage box at a slot that will not conflict with other wafers or module plates that are already stored in the wafer storage box (step 1016), with the operation ending thereafter.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Thus, the illustrative embodiments provide mechanisms for a module plate that holds a set of modules to be automatically tested as well as an apparatus and method that automatically tests a set of modules in the inventive module plate utilizing repurposed integrated circuit wafer testing equipment. Utilizing the inventive module plate, a set of modules are automatically tested in parallel or sequentially utilizing the repurposed integrated circuit wafer testing equipment. The module plate is similar in diameter to an integrated circuit wafer but has a height that provides for a set of modules to be inserted into the module plate. The module plate has cutouts that are wide enough to hold an associated set of modules with pins up such that each module is supported either on all four sides, on just two sides, or, if the module is an end module, on three sides. The module plate conforms to the diameter of current integrated circuit wafers so that holder profile of a wafer handler is able to grasp a particular module plate and move the module plate to a module insertion mechanism. Once the module plate is loaded with a set of modules conforming to the size of the cutouts in the module, the wafer handler places the module plate in a chuck of a testing mechanism for parallel or sequential module testing. Once the testing is complete, the wafer handler removes the module plate from the chuck of the testing mechanism and places the module plate with the set of modules into the wafer storage box for storage. Thus, the illustrative embodiment provides for automatically testing a set of modules utilizing a repurposed integrated circuit wafer testing equipment.

Figure 11:
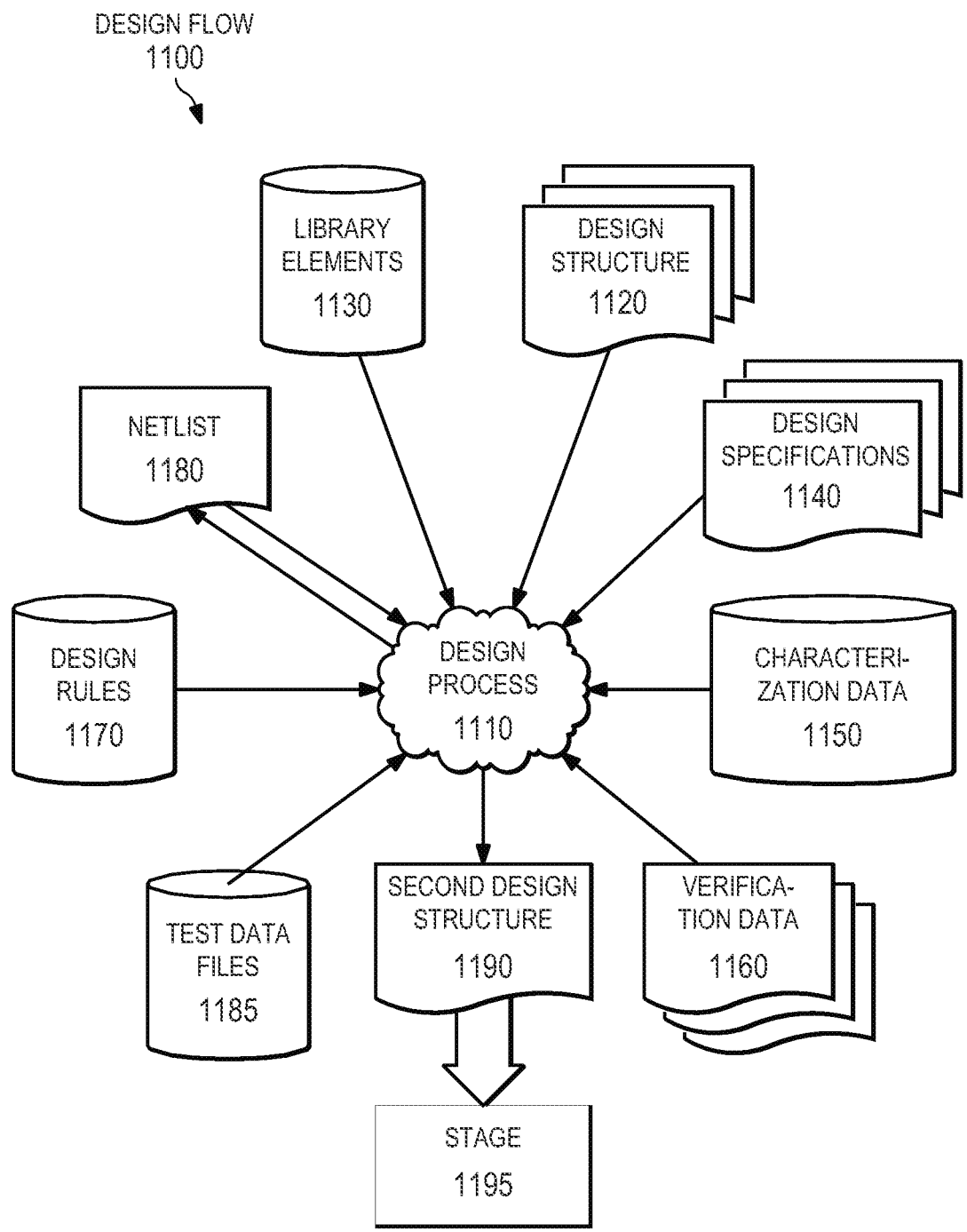
FIG. 11 shows a block diagram of an exemplary design flow used for example, in semiconductor IC logic design, simulation, test, layout, and manufacture in accordance with an illustrative embodiment.

FIG. 11 shows a block diagram of an exemplary design flow 1100 used for example, in semiconductor IC logic design, simulation, test, layout, and manufacture in accordance with an illustrative embodiment. Design flow 1100 includes processes, machines, and/or mechanisms for processing design structures or devices to generate logically or otherwise functionally equivalent representations of the design structures and/or devices described above and shown in FIGS. 2-9. The design structures processed and/or generated by design flow 1100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of fhe physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 2-9. As such, design structure 1120 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 2-9 to generate a netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including Netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110 without deviating from the scope and spirit of the invention. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190. Design structure 1190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-9. In one embodiment, design structure 1190 may comprise a compiled, executable HDL simulation model that functionally simulates the devices shown in FIGS. 2-9.

Design structure 1190 may also employ a data format used for the exchange of layout data of integrated circuits and/or symbolic data format (e.g. information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-9. Design structure 1190 may then proceed to a stage 1195 where, for example, design structure 1190: proceeds to tape-out, is released to manufacturing, is released to a mask house, is sent to another design house, is sent back to the customer, etc.

As noted above, it should be appreciated that the illustrative embodiments may take the form of an entirety hardware embodiment, an entirely software embodiment or an embodiment containing both hardware and software elements. In one example embodiment, mechanisms of the illustrative embodiments are implemented in software or program code, which includes but is not limited to firmware, resident software, microcode, etc. in order to test a set of modules in a module plate either in parallel or synchronously A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A module plate for use with a wafer handler and testing mechanism, comprising:
   a diameter equivalent to an integrated circuit wafer;
   a height equivalent to or less than a height of a module lid associated with each module in a plurality of modules associated with the module plate; and
   a plurality of cutouts in the module plate that have a width equivalent to a width of the module lid and at least a length equivalent to a length of the module lid, wherein the height of the module plate is such that, when a test head contacts a module base of each module in a plurality of modules, the module lid contacts a chuck on which the module plate resides during testing of the module thereby providing resistance in order to accurately test the module.

2. The module plate of claim 1, wherein the height of the module plate differs depending on the module that is to be tested.

3. The module plate of claim 1, wherein the plurality of cutouts differs depending on the module that is to be tested.

4. The module plate of claim 1, wherein each cutout in the plurality of cutouts has a length equivalent to the length of the module lid such that only one module in the plurality of modules may be inserted into the cutout.

5. The module plate of claim 4, wherein when the module is inserted into the cutout, the module base associated with the module rests on four rails that surround the cutout.

6. The module plate of claim 1, wherein each cutout in the plurality of cutouts has a length equivalent to a multiple of the length of the module lid such that more than one module in the plurality of modules may be inserted into the cutout.

7. The module plate of claim 6, wherein when the module is inserted into the cutout, the module base associated with the module rests on two or three rails that surround the cutout.

8. The module plate of claim 1, wherein the module base of each module in the plurality of modules that is larger than the cutout in which the module is to be placed and wherein the module base comprises a module ring that surrounds the module base.

9. The module plate of claim 8, wherein the module ring is a natural part of the module base or an added component to the module base.

10. An apparatus for testing a plurality of modules in a module plate comprising:
    a processor; and
    a memory coupled to the processor, wherein the memory comprises instructions which, when executed by the processor, cause the processor to:
    receive the module plate comprising the plurality of modules, wherein the module plate comprises:
       a diameter equivalent to an integrated circuit wafer,
       a height equivalent to or less than a height of a module lid associated with each module in the plurality of modules associated with the module plate; and
       a plurality of cutouts in the module plate that have a width equivalent to a width of the module lid and at least a length equivalent to a length of the module lid; and
    test each module in the plurality of modules by contacting the module though a test head that contacts a module base of the module and in relation the module lid of the module contacts a chuck on which the module plate resides thereby providing resistance in order to accurately test the module.

11. The apparatus of claim 10, wherein the height of the module plate differs depending on the module that is to be tested.

12. The apparatus of claim 10, wherein the plurality of cutouts differs depending on the module that is to be tested.

13. The apparatus of claim 10, wherein each cutout in the plurality of cutouts has a length equivalent to the length of the module lid such that only one module in the plurality of modules may be inserted into the cutout.

14. The apparatus of claim 13, wherein when the module is inserted into the cutout, the module base associated with the module rests on four rails that surround the cutout.

15. The apparatus of claim 10, wherein each cutout in the plurality of cutouts has a length equivalent to a multiple of the length of the module lid such that more than one module in the plurality of modules may be inserted into the cutout.

16. The apparatus of claim 15, wherein when the module is inserted into the cutout, the module base associated with the module rests on two or three rails that surround the cutout.

17. The apparatus of claim 10, wherein the module base of each module in the plurality of modules that is larger than the cutout in which the module is to be placed and wherein the module base comprises a module ring that surrounds the module base.

18. The apparatus of claim 17, wherein the module ring is a natural part of the module base or an added component to the module base.

* * * * *